US007567124B2

United States Patent
Lih

(10) Patent No.: US 7,567,124 B2
(45) Date of Patent: Jul. 28, 2009

(54) SYMMETRICAL DIFFERENTIAL AMPLIFIER

(75) Inventor: Yolin Lih, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 97 days.

(21) Appl. No.: 11/764,159

(22) Filed: Jun. 15, 2007

(65) Prior Publication Data

US 2008/0309408 A1     Dec. 18, 2008

(51) Int. Cl.
    *H03F 3/45*     (2006.01)
(52) U.S. Cl. .................. 330/253; 330/257; 330/261
(58) Field of Classification Search .................. 330/253, 330/257, 261
    See application file for complete search history.

(56) References Cited

U.S. PATENT DOCUMENTS 4,728,900 A * 3/1988 Nakagawara et al. ....... 330/253
7,279,974 B2 * 10/2007 Rowley ...................... 330/253

* cited by examiner

*Primary Examiner*—Khanh V Nguyen
(74) *Attorney, Agent, or Firm*—Osha • Liang LLP

(57) ABSTRACT

A differential amplifier has improved power efficiency, reduced offset penalty and a symmetrical output differential signal. Such a differential amplifier may include: (a) a bias circuit that has a first input device and a second input device; (b) a first load device and a second load device, each biased by a bias voltage from the bias circuit; and (c) a third input device and a fourth input device that are connected in series with the first load device and the second load device, respectively. In that differential amplifier, the differential input signal is applied across the first and second input devices, as well as across the third and the fourth input devices. The first, second, third and fourth input devices are sized such that a total current in the first and second input devices bears a predetermined ratio to a total current in the third and fourth input devices.

27 Claims, 2 Drawing Sheets

SYMMETRICAL DIFFERENTIAL AMPLIFIER

BACKGROUND OF THE INVENTION

Differential amplifiers are common building blocks in integrated circuits. FIG. 1 shows differential amplifier 100, having a configuration known as "current mirror, plus source-coupled pair." As shown in FIG. 1, differential amplifier 100 receives input signals INPUT0 and INPUT1 on gate terminals 111 and 112 of NMOS input transistors 103 and 104, respectively. Typically, input signals INPUT0 and INPUT1 constitute a differential signal. The source terminals of NMOS transistors 103 and 104 are connected in common ("COMMON SOURCE"). In differential amplifier 100, PMOS "load" transistor 101, which has its drain and gate terminals connected in common, provides a bias voltage ("BIAS"), which is "mirrored" to the gate terminal of PMOS transistor 102. Differential amplifier 100 also includes an enable and bias circuit which includes NMOS transistor 105. The gate terminal of NMOS transistor 105 receives signal enable_bias, which is deasserted when disabling of differential amplifier 100 is desired. When enable_bias is active, NMOS transistor 105 serves as a constant current source or a nearly constant current source.

As seen in FIG. 1, only signal OUTPUT1 at output terminal 114 can move within a substantial range between the supply voltage and the ground reference. Hence, differential amplifier does not provide a symmetrical output. Typically, the current source provided by the current mirror (i.e., PMOS transistor 101) is set to half in differential amplifier 100. Little current gain in the output is therefore provided under this arrangement, resulting in poor power efficiency.

To provide symmetrical output signals, the prior art uses two copies of differential amplifier 100 connected in the manner shown in FIG. 2. In FIG. 2, differential amplifiers 201 and 202 each receive the differential voltage across input terminals 210 and 211, but in opposite polarities. The asymmetrical output terminals 212 and 213 of differential amplifiers 201 and 202 provide a symmetrical differential output signal.

SUMMARY OF THE INVENTION

According to one embodiment of the present invention, a differential amplifier receives a differential input signal and provides a symmetrical differential output signal, The differential amplifier includes: (a) a bias circuit having a first input device and a second input device; (b) a first load device and a second load device, each biased by a bias voltage from the bias circuit; and (c) a third input device and a fourth input device that are connected in series with the first load device and the second load device, respectively. In that differential amplifier, the differential input signal is applied across the first and second input devices, as well as across the third and the fourth input devices. The first, second, third and fourth input devices are sized such that a total current in the first and second input devices bears a predetermined ratio to a total current in the third and fourth input devices.

In one embodiment, the first, the second, the third and the fourth input devices are transistors coupled together at their source terminals.

The present invention is better understood upon consideration of the detailed description below and the accompanying drawings.

DETAILED DESCRIPTION OF THE PREFERRED EMBODIMENTS

Figure 1:
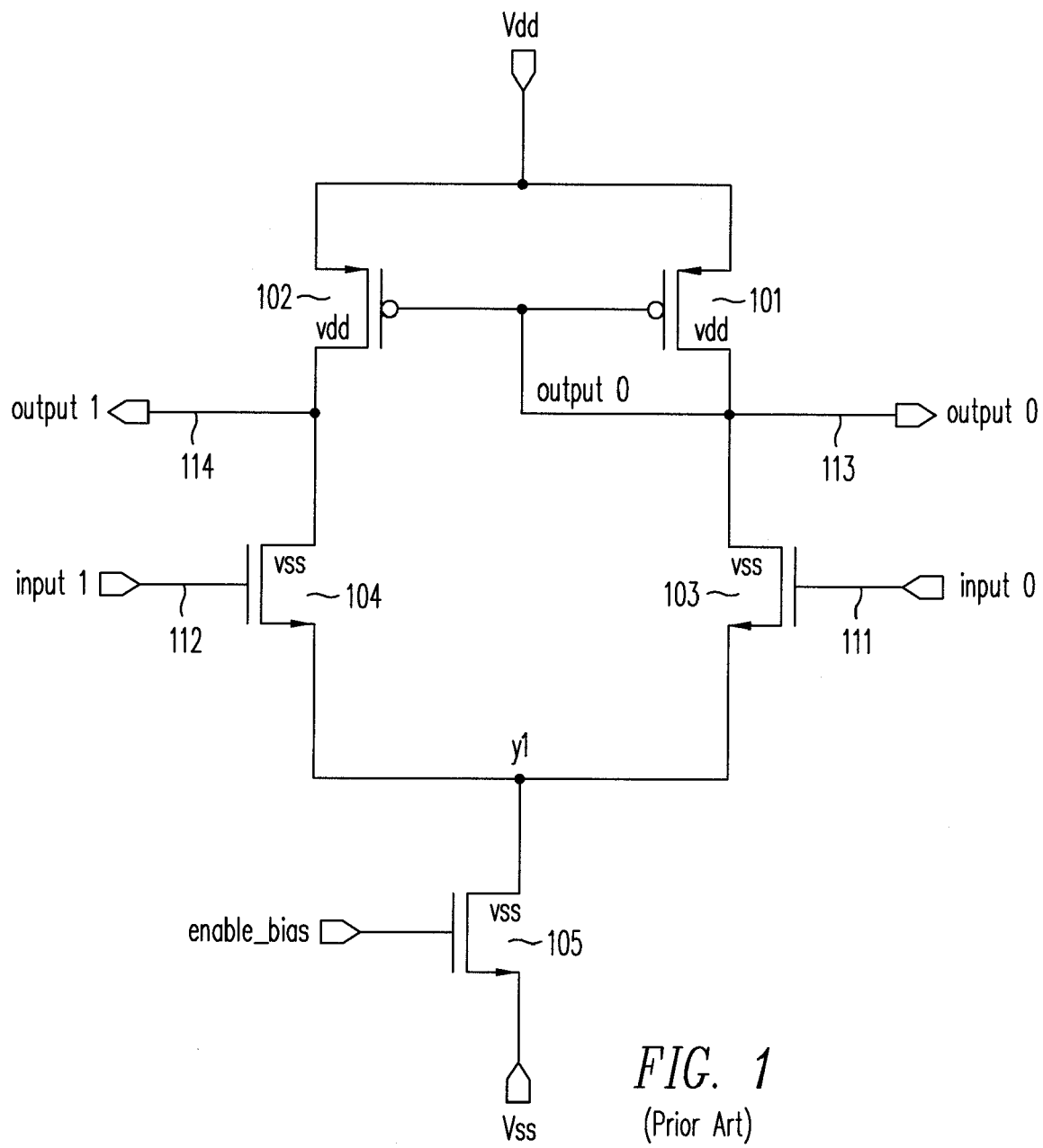
FIG. 1 shows differential amplifier 100, having a configuration commonly known as "current mirror, plus source-coupled pair."
Figure 2:
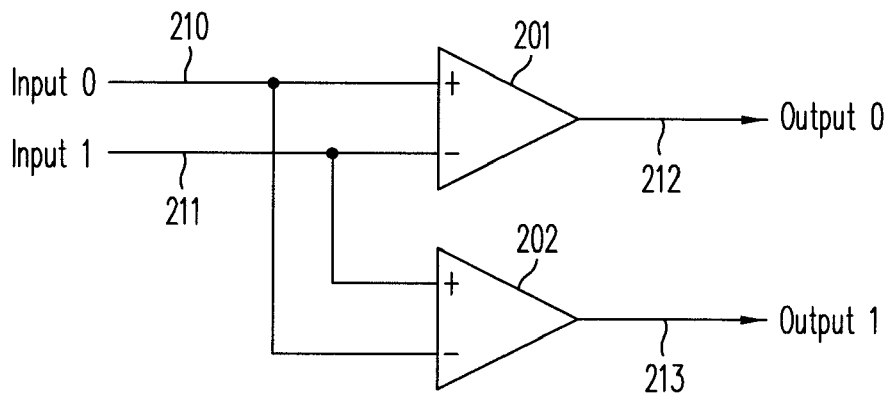
In FIG. 2, differential amplifiers 201 and 202 each receive the differential voltage across input terminals 210 and 211, but in opposite polarities.

The present invention provides both a differential amplifier having a symmetrical differential output signal, and the principles of operation thereof. The differential amplifier is associated with a bias circuit that is a fraction the size of its amplification portion. The differential amplifier improves over other conventional differential amplifiers (e.g., differential amplifier 100 of FIG. 1) in power efficiency.

Figure 3:
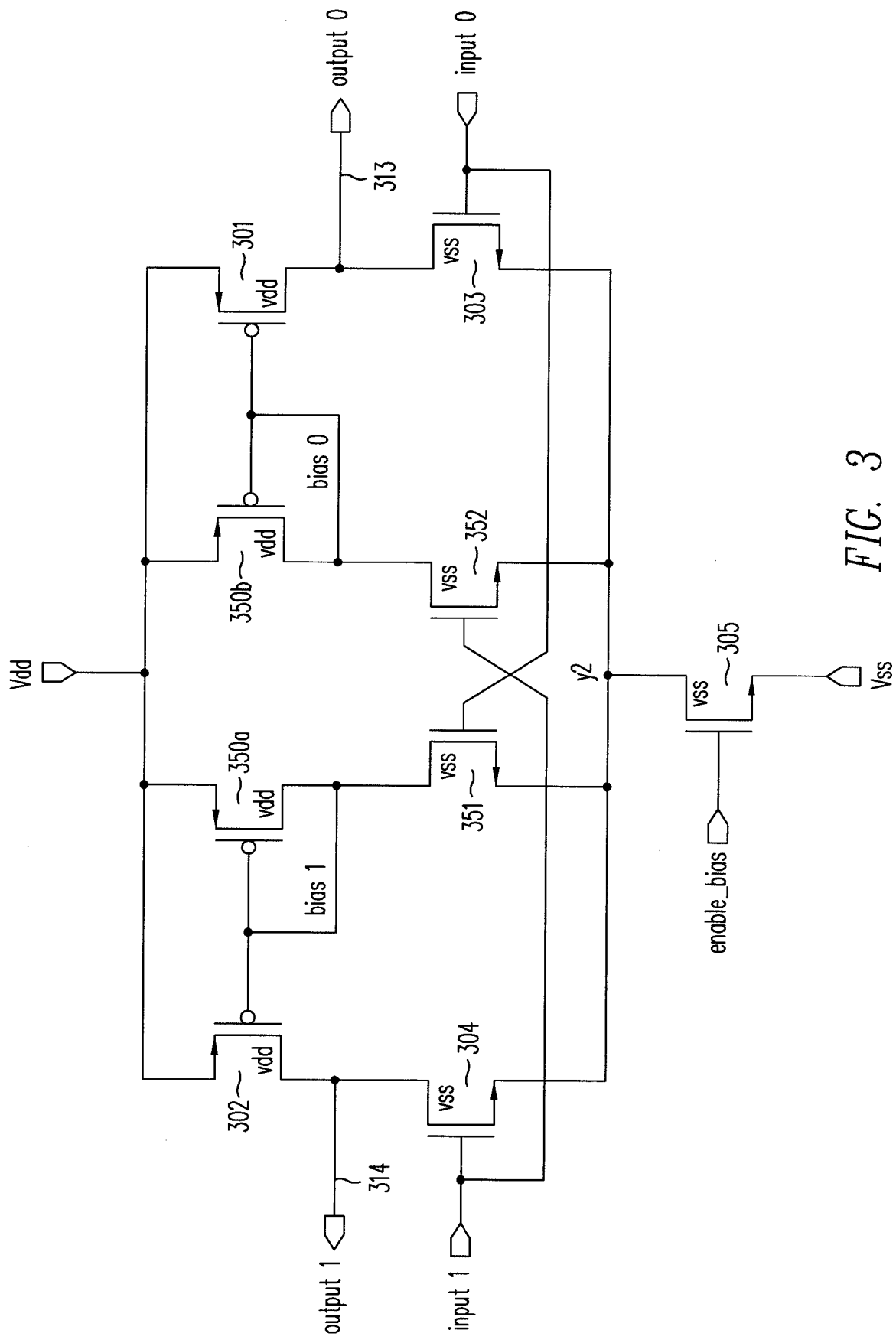
FIG. 3 shows differential amplifier 300, according to one embodiment of the present invention.

FIG. 3 shows differential amplifier 300, according to one embodiment of the present invention. As shown in FIG. 3, differential amplifier 300 includes two current paths controlled by input signals INPUT0 and INPUT1 on terminals 311 and 312. The first current path, formed by PMOS load transistor 301, and NMOS transistor 303, is controlled by input signal INPUT0. The second current path, formed by PMOS load transistor 302 and NMOS transistors 304, is controlled by input signal INPUT1. In addition, differential amplifier 300 includes a bias voltage-generating circuit formed by PMOS transistor 350a and 350b, and NMOS transistors 351 and 352. PMOS transistors 350a and 350b, each having its drain and gate terminals connected in common, provide bias voltages "bias 1" and "bias 2" which are provided to the gate terminals of PMOS transistors 301 and 302, respectively. NMOS transistors 351 and 352 are controlled respectively by input signals INPUT0 and INPUT1. The source terminals of NMOS transistors 303, 304, 351 and 352 are connected in common ("COMMON SOURCE"). In differential amplifier 300, the currents in the first and second current paths flow to the ground reference through NMOS transistor 305. When the enable_bias signal at the gate terminal of NMOS transistor 305 is active (i.e., asserted), currents are allowed to flow in the first and second current paths of NMOS transistors 303 and 304.

Unlike differential amplifier 100, however, the signals OUTPUT0 and OUTPUT1 on output terminals 313 and 314 are both allowed to move freely over a substantial range between the power supply voltage and the ground reference, thus providing a symmetrical differential output signal. In addition, unlike differential amplifier 100, the current source PMOS transistor 350 need not be sized to provide half the current flowing in the differential amplifier. In fact, the size of PMOS transistor 350 may be 1/k the size of PMOS transistors 301 and 302, where k is a value greater than 1.0 to achieve a power efficiency. A suitable value of k may be, for example, ten (10). With NMOS transistors 351 and 352 also correspondingly sized, relative to NMOS transistors 303 and 304 (i.e., each of NMOS transistors 351 and 352 being 1/k the size of corresponding one of NMOS transistor 303 and 304), an improved power efficiency is realized. At least a current gain by a factor of two is achieved. With k equals to ten, the current gain of approximately two is achieved. For example, in one implementation of differential amplifier 300, where the channel length is nominally 80 nm under a 65-nm 11-metal layer one-volt process, PMOS transistors 301 and 302 and NMOS transistors 303, 304 and 305 each provided a "drawn" width of 2 μm, while PMOS transistors 350a and 350b and NMOS transistors 351 and 352 are each provided a "drawn" width of 0.3 μm.

Further, unlike differential amplifier 100, where signal OUTPUT1 is slaved on terminal 114 is slaved to the current source 101, in differential amplifier 300, output signals OUTPUT0 and OUTPUT1 on terminals 313 and 314 are slaved to the current sources of PMOS transistor 350a and 350b, respectively. Also, unlike differential amplifier 200, where OUTPUT1 and OUTPUT2 at terminals 212 and 213 are slaved independently to the respective current sources, OUTPUT1 and OUTPUT2 are source-coupled.

Although FIG. 3 shows load transistors 301 and 302 to be PMOS transistors, and input transistors 303 and 304 are shown to be NMOS transistors, an alternative embodiment may provide the load transistors to be NMOS, and the input transistors to be PMOS.

In one embodiment, the transistors of the differential amplifiers may be fabricated under a 65-nm 11-metal layer one-volt process. Under that process, the transistors of the differential amplifier may have channel lengths of 65 nm. PMOS transistors 350a, 350b and NMOS transistors 351 and 352 each have a width of 0.3 um. Correspondingly, the PMOS load transistors 301 and 302 and the source-coupled NMOS transistors each have a width of 2 um. In that implementation, the current gain is at least twice that of the conventional current mirror, source-coupled differential amplifier (e.g., differential amplifier 100 of FIG. 1) having transistors of 2 um widths and the 80 um channel lengths with the same total current. A 60% improvement in output slew rate is also achieved without a greater current consumption.

The hardware described above, including any logic or transistor circuit, may be generated automatically by computer based on a description of the hardware expressed in the syntax and the semantics of a hardware description language, as known by those skilled in the art. Applicable hardware description languages include those provided at the layout, circuit netlist, register transfer, and schematic capture levels. Examples of hardware description languages include GDS II and OASIS (layout level), various SPICE languages and IBIS (circuit netlist level), Verilog and VHDL (register transfer level) and Virtuoso custom design language and Design Architecture-IC custom design language (schematic capture level).

The above detailed description is provided to illustrate specific embodiments of the present invention and is not intended to be limiting. Numerous modifications and variations within the scope of the present invention are possible. The present invention is set forth in the accompanying drawings.

I claim:

1. A differential amplifier that receives a differential input signal and provides a symmetrical differential output signal, comprising:
    a first bias circuit and a second bias circuit receiving as input signals a first end and a second end of the differential input signal, and providing, respectively, a first bias voltage and a second bias voltage;
    a first load device and a second load device, biased by the first and second bias voltages respectively;
    wherein the first bias circuit and the second bias circuit are smaller that the first load device and second load device, respectively,
    a first input device and a second input device, connected in series with the first load device and the second load device, respectively, and receiving as input signals the first end and the second end of the differential input signal, respectively, each of the first input device and the second input device conducting a current in response to its respective input signal;
    a third input device and a fourth input device, connected in series with the first bias circuit and the second bias circuit, respectively, and receiving as input signals the second end and the first end of the differential input signal, respectively, each of the third input device and the fourth input device conducting a current in response to its respective input signal;
        wherein the third input device and the fourth input device are smaller than the first input device and the second input device, respectively, and
    a current source coupled to the first input device and second input device, the current source maintaining a sum of the currents in the first input device and the second input device to substantially constant value.

2. The differential amplifier of claim 1, wherein the first bias circuit includes a first current source device and wherein the first bias circuit and the first load device are both characterized by a current parameter, and wherein the value of the current parameter in the first current source device bears a predetermined ratio to the value of the current parameter in the first load device, and wherein the current parameter is less than one.

3. The differential amplifier of claim 2, wherein the second bias circuit includes a second current source device and wherein the second bias circuit and the second load device are both characterized by the current parameter, and wherein the value of the current parameter in the second current source device bears the predetermined ratio to the value of the current parameter in the second load device.

4. The differential amplifier of claim 1, wherein the first and second input devices comprise NMOS transistors.

5. The differential amplifier of claim 1, wherein the first and second input devices comprise PMOS transistors.

6. The differential amplifier of claim 1, wherein the first bias circuit comprises a diode-connected transistor in series with an input transistor receiving the input signal of the first bias circuit.

7. The differential amplifier of claim 1, wherein the first and second load transistors comprise PMOS transistors.

8. The differential amplifier of claim 1, wherein the first and second load transistors comprise NMOS transistors.

9. The differential amplifier of claim 1, further comprising an enable circuit that enables the current source when a control signal becomes active.

10. The differential amplifier of claim 1, wherein the first and second load devices each include an output terminal, and wherein the symmetrical differential output signal is provided by the voltage across the output terminals of the first and second load devices.

11. The differential amplifier of claim 1, wherein the first bias circuit, the second bias circuit, the third input device, and the fourth input device are one tenth the size of the first load device, the second load device, the first input device, and the second input device respectively.

12. The differential amplifier of claim 1,
wherein the first bias circuit, the second bias circuit, the third input device, and the fourth input device are each provided with a drawn width of 0.3 micrometers, and
wherein the first load device, the second load device, the first input device, and the second input device are each provided with a drawn width of 2 micrometers.

13. A method for providing a differential amplifier that receives a differential input signal and that provides a symmetrical differential output signal, comprising:
receiving into a first bias circuit and a second bias circuit as input signals a first end and a second end of the differential input signal, and providing, from the first and second bias circuits, respectively, a first bias voltage and a second bias voltage;
connecting a first input device and a second input device in series with a first load device and a second load device, the first and second input devices configured to receive as input signals the first end and the second end of the differential input signal, respectively, such that each of the first input device and the second input device conducting a current in response to its respective input signal;
wherein the first bias circuit and the second bias circuit are smaller that the first load device and second load device, respectively,
connecting a third input device and a fourth input device in series with a first bias circuit and a second bias circuit, the third and fourth input devices configured to receive as input signals the second end and the first end of the differential input signal, respectively, such that each of the third input device and the fourth input device conducting a current in response to its respective input signal;
wherein the third input device and the fourth input device are smaller than the first input device and the second input device, respectively,
coupling a current source to the first input device and second input device, the current source maintaining a sum of the currents in the first input device and the second input device to substantially constant value, when enabled by an enable signal; and
enabling the current source and biasing a first load device and a second load device by the first and second bias voltages respectively.

14. The method of claim 13, wherein the first bias circuit and the first load device are both characterized by a current parameter, the method further comprising providing in the first bias circuit a first current source device such that the value of the current parameter in the first current source device bears a predetermined ratio to the value of the current parameter in the first load device, the current parameter being less than one.

15. The method of claim 14, wherein the second bias circuit and the second load device are both characterized by the current parameter, and wherein the method further comprising providing in the second bias circuit a second current source device such that the value of the current parameter in the second current source device bears the predetermined ratio to the value of the current parameter in the second load device.

16. The method of claim 13, wherein the first and second input devices comprise NMOS transistors.

17. The method of claim 13, wherein the first and second input devices comprise PMOS transistors.

18. The method of claim 13, wherein the first bias circuit comprises a diode-connected transistor in series with an input transistor receiving the input signal of the first bias circuit.

19. The method of claim 13, wherein the first and second load transistors comprise PMOS transistors.

20. The method of claim 13, wherein the first and second load transistors comprise NMOS transistors.

21. The method of claim 13, wherein the first and second load devices each include an output terminal, the method further comprising providing the voltage across the output terminals of the first and second load devices as the symmetrical differential output signal.

22. A differential amplifier, comprising:
a first load transistor having a gate terminal for receiving a first bias voltage and a drain terminal for providing one end of an output differential signal;
a first input transistor having a gate terminal for receiving one end of a differential input signal, a drain terminal connected to the drain terminal of the first load transistor and a source terminal;
a second load transistor having a gate terminal for receiving a second bias voltage and a drain terminal for providing the other end of an output differential signal;
a second input transistor having a gate terminal for receiving the other end of a differential input signal, a drain terminal connected to the drain terminal of the second load transistor and a source terminal connected to the source terminal of the first input transistor; and
a bias circuit receiving the differential input signal to provide the first and second bias voltages,
wherein the bias circuit is smaller than the first load transistor, the second load transistor, the first input transistor, and the second input transistor.

23. The differential amplifier of claim 22, wherein the bias circuit further comprising:
a first current-sourcing transistor and a second current-sourcing transistor each having a drain terminal and a gate terminal connected together for providing a respective one of the first and second bias voltages;
a third input transistor having a gate terminal for receiving one end of the differential input signal; and
a fourth input transistor receiving having a gate terminal for receiving the other end of the differential input signal.

24. The differential amplifier of claim 23, wherein the first current-sourcing transistor, the second current-sourcing transistor, the third input transistor, and the fourth input transistor are each sized less than the first load transistor, the second load transistor, the first input transistor, and the second input transistor, respectively.

25. The differential amplifier of claim 22, further comprising an enabling circuit.

26. A differential amplifier that receives a differential input signal and provides a symmetrical differential output signal, comprising:
means for biasing that receives a first end and a second end of the differential input signal and that provides a first bias voltage and a second bias voltage;
first means for providing a load current and second means for providing a load current, the first and second means for providing a load current being biased by the first and second bias voltages, respectively; and
first and second means, connected in series with the first and second means for providing a load current, respectively, for receiving the second end and the first end of the differential input signal, respectively, and providing the first end and the second end of the differential output signal, respectively, wherein the means for biasing is smaller than the means for providing the load current and the first and second means.

27. The differential amplifier of claim 26, wherein the means for biasing includes a first current source device and a second current source device and each of the current source devices and each of the means for providing a load current are characterized by a current parameter, and wherein the value of the current parameter in the first current source device bears a predetermined ratio to the value of the current parameter in the first means for providing a load current, and wherein the current parameter is less than one.

* * * * *